(12) United States Patent
Papamichail et al.

(10) Patent No.: US 9,531,339 B2
(45) Date of Patent: Dec. 27, 2016

(54) INTEGRATED CIRCUIT FOR TRANSMITTING AND RECEIVING AN RF SIGNAL

(71) Applicant: Dialog Semiconductor B.V., 's-Hertogenbosch (NL)

(72) Inventors: Michail Papamichail, Eindhoven (NL); Wilhelmus Aart Johannes Aartsen, Enschede (NL); Johannes Gerardus Willms, Oosterhout (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 301 days.

(21) Appl. No.: 14/203,937

(22) Filed: Mar. 11, 2014

(65) Prior Publication Data

US 2014/0266500 A1    Sep. 18, 2014

(30) Foreign Application Priority Data

Mar. 15, 2013 (EP) .................................. 13159469

(51) Int. Cl.
| | |
|---|---|
| *H03H 7/38* | (2006.01) |
| *H03H 7/40* | (2006.01) |
| *H03H 7/42* | (2006.01) |
| *H01P 1/10* | (2006.01) |
| *H04B 1/04* | (2006.01) |
| *H04B 1/18* | (2006.01) |

(52) U.S. Cl.
CPC ........ *H03H 7/38* (2013.01); *H01P 1/10* (2013.01); *H03H 7/40* (2013.01); *H03H 7/42* (2013.01); *H03H 7/425* (2013.01); *H04B 1/0458* (2013.01); *H04B 1/18* (2013.01)

(58) Field of Classification Search
CPC .............. H03H 7/38; H03H 7/40; H03H 7/42; H03H 7/425; H04B 1/0458; H04B 1/18; H01P 1/10
USPC ........................... 333/32–35, 17.3, 124, 101
See application file for complete search history.

(56) References Cited

U.S. PATENT DOCUMENTS

| | | |
|---|---|---|
| 2005/0090287 A1 | 4/2005 | Rofougaran |
| 2005/0208917 A1 | 9/2005 | Roufoogaran et al. |
| 2010/0109798 A1* | 5/2010 | Chu .................. H03H 7/38 |
| | | 333/124 |

OTHER PUBLICATIONS

European Search Report, Application No. 13159469.9-1852, Applicant: Dialog Semiconductor B.V., Mail date Oct. 15, 2013, 4 pgs.

* cited by examiner

*Primary Examiner* — Benny Lee
*Assistant Examiner* — Albens Dieujuste
(74) *Attorney, Agent, or Firm* — Saile Ackerman LLC; Stephen B. Ackerman (57) ABSTRACT

An integrated circuit, comprising a single-ended pin for transmitting and/or receiving an RF signal. A first matching network is configured to match an impedance of the RF signal. A second matching network is configured to match an impedance of an on-chip differential circuit. A third matching network is configured to match an impedance of an on-chip single-ended circuit, wherein the third matching network is connectable to the first matching network. A transformer is connected or connectable to the second matching network and to the first matching network. Switches control an operating mode of the integrated circuit The second matching network is connected with the first matching network via the transformer, or the third matching network is connected with the first matching network.

30 Claims, 7 Drawing Sheets

INTEGRATED CIRCUIT FOR TRANSMITTING AND RECEIVING AN RF SIGNAL

TECHNICAL FIELD

The invention relates to an integrated circuit. The invention further relates to an integrated circuit for transmitting and/or receiving an RF signal. The invention further relates to impedance matching in such an integrated circuit.

BACKGROUND

Figure 1:
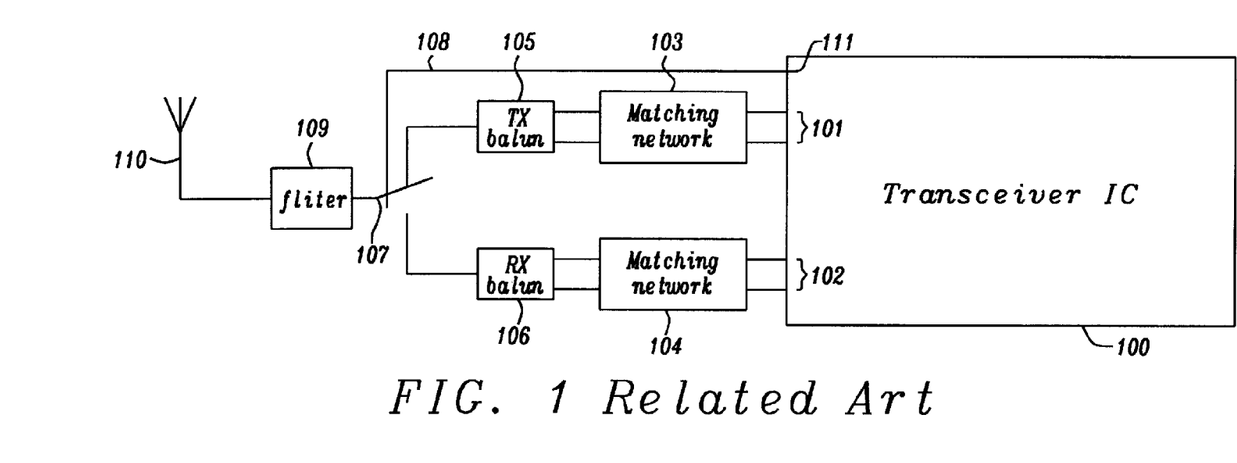
FIG. 1 illustrates components of a related transceiver setup.

A transceiver integrated circuit (IC) is an IC that can transmit and receive signals. A related transceiver IC 100 is shown in FIG. 1. As shown, the IC 100 has a separate transmit output 101 and a separate receive input 102. The input 102 and output 101 can be single-ended or differential. This input 102 and output 101 is normally connected to the circuitry outside the transceiver IC perimeter by means of bonding wires or other connections, such as Wafer Level Chip Scale Packaging (WLCSP) balls. For example, the transceiver IC 100 contains an on-chip LNA and an on-chip PA. Outside the IC perimeter, this input 102 and output 101 may be matched with a matching network 103, 104 to a specific impedance. In case of a differential input 102 or output 101, a so-called balun (balanced to unbalanced) converter 105, 106 is used to obtain a single-ended signal. In order to connect the matched input or matched output to the antenna 110, a switch 107 is used. This switch 107 is placed outside the perimeter of the IC 100 and is normally a pin-diode switch or a similar switching device. The switch 107 is controlled by the transceiver IC using a control line 108 that is connected to a specific pin of the IC. In between the switch 107 and the antenna 110, a frequency selective device (filter) 109 may be used to reduce the unwanted spurious and harmonics during transmit and to reduce the effect of unwanted blocking signals during receive.

Radio Frequency (RF) knowledge and skills are necessary to design a printed circuit board with the relevant matching networks, baluns, switch and frequency selective device.

SUMMARY

It is an object of the invention to provide an improved integrated circuit for transmitting and/or receiving an RF signal.

According to a first aspect of the invention, integrated circuit is provided that comprises:

a single-ended pin for transmitting and/or receiving an RF signal;

a first matching network to match an impedance of the RF signal;

a second matching network to match an impedance of an on-chip differential circuit;

a third matching network to match an impedance of an on-chip single-ended circuit, wherein the third matching network is connectable to the first matching network;

a transformer having a primary side connected or connectable to the second matching network and a secondary side connected or connectable to the first matching network;

a set of at least one switch for controlling an operating mode of the integrated circuit, wherein in a first operating mode, the second matching network is connected with the first matching network via the transformer, and in a second operating mode, the third matching network is connected with the first matching network.

This IC can provide a single pin that can be connected to, for example, an antenna, without need for a matching network outside of the IC. Therefore, an external printed circuit board carrying the baluns and matching networks is no longer needed. Moreover, the IC can operate with both single-ended and differential on-chip electronics, using the same pin, without need for a balun outside of the IC. The switches allow the IC to switch between differential mode and single-ended mode for internal processing of the signals, by including the transformer as a balun.

At least one switch in the set of at least one switch may be configured to act, when open, as a capacitor that is part of at least one of the matching networks. This allows to reduce the IC area, which is needed for the matching, because there is no need for a separate switch and capacitor.

In an embodiment, either of the differential circuit and the single-ended circuit comprises a low-noise amplifier "LNA" for amplifying a signal received from the pin, and the other of the differential circuit and the single-ended circuit comprises a power amplifier "PA" for amplifying a signal that is to be provided to the single-ended pin. This way, the circuit can use different kinds of circuit (differential or single-ended) for receiving and transmitting, respectively. For example, the LNA is part of the differential circuit, and the PA is part of the single-ended circuit. Alternatively, the LNA is part of the single-ended circuit, and the PA is part of the differential circuit. Alternatively, the single-ended circuit and the differential circuit can have any kind of appropriate circuitry, such as amplifying circuitry.

The differential circuit may comprise the low-noise amplifier, and the single-ended circuit may comprise the power amplifier. This may help to reduce the supply power consumption of the power amplifier circuitry. Also, the influence of unwanted common mode signals entering the low-noise amplifier may be reduced.

Either of the first operating mode and the second operating mode may be an RF signal receiving mode. The other operating mode may be an RF signal transmitting mode. This way, it is possible to choose a different type of circuit (differential or single-ended) for the receiving mode and for the transmitting mode.

The differential circuit may be configured to process signals according to a first transmission standard. The single-ended circuit may be configured to process signals according to a second transmission standard. Herein, the first transmission standard is different from the second transmission standard. The matching circuits can be optimized for different transmission standards.

In the second operating mode, the secondary side of the transformer may be configured to form part of the first and/or third impedance matching network. This configuration can be implemented in a circuit that uses relatively little space In the first operating mode, one end of the secondary side of the transformer may be grounded. This way, the transformer may be configured to act as a balun.

The set of switches may comprise first switches to connect two ends of the primary side of the transformer with a ground, and a second switch to connect an end of the secondary side of the transformer with a ground, and wherein in the first operating mode, the first switches are open and the second switch is closed; and in the second operating mode, the first switches are closed and the second switch is open.

This is a suitable configuration for implementing the switches. Moreover, this configuration is a suitable one to re-use the transformer in the second operating mode. Moreover, in the second operating mode, the second switch may be configured to act as a capacitor forming part of the third impedance matching network, to further reduce the number of elements of the circuit.

In an aspect of the invention, the set of switches may comprise a first switch to connect an end of the secondary side of the transformer with the single-ended pin and a second switch, wherein the second switch connects a signal line of the single-ended circuit with ground, and wherein in the first operating mode, the first switch is closed and the second switch is closed; and in the second operating mode, the first switch is open and the second switch is open.

This provides a configuration to realize two operating modes, one enabling a single-ended circuit and one enabling a differential circuit.

In an aspect of the invention, the set of switches may comprise a first switch to connect two ends of the secondary side of the transformer, and a second switch to connect an end of the secondary side of the transformer with a ground, and wherein in the first operating mode, the first switch is open and the second switch is closed; and in the second operating mode, the first switch is closed and the second switch is open.

This provides a configuration to realize two operating modes, one enabling a single-ended circuit and one enabling a differential circuit.

At least part of the circuit may be configured to act as a band-pass or a low-pass filter. This helps to enable the circuit to perform useful signal filtering or conditioning.

Two ends of the secondary side of the transformer may be connected by means of a capacitor that is tunable or switchable. The tunable or switchable capacitor can be used to adjust or fine-tune the matching, for example to support varying conditions. Moreover, the capacitor may be configured to be switched between capacitance values needed to match an impedance of two different transmission standards.

It is a further object of the invention to provide a method of transmitting and/or receiving an RF signal. According to this aspect of the invention, a method of Transmitting and/or receiving an RF signal is provided that comprises the steps of:

transmitting and/or receiving an RF signal by a single-ended pin;

matching an impedance of the RF signal by a first matching network;

matching an impedance of an on-chip differential circuit by a second matching network;

matching an impedance of an on-chip single-ended circuit by a third matching network, wherein the third matching network is connectable to the first matching network;

connecting a transformer having a primary side to the second matching network and a secondary side to the first matching network;

controlling an operating mode of the integrated circuit by a set of at least one switch, wherein in a first operating mode, the second matching network is connected with the first matching network via the transformer, and in a second operating mode, the third matching network is connected with the first matching network.

The person skilled in the art will understand that the features described above may be combined in any way deemed useful.

BRIEF DESCRIPTION OF THE DRAWINGS

In the following, aspects of the invention will be elucidated by means of examples, with reference to the drawings. The drawings are diagrammatic and may not be drawn to scale.

DESCRIPTION

The present disclosure allows, inter alia, to combine the balun, matching network, switch and frequency selective device, as shown in FIG. 1, into a compact multifunctional structure on an IC. The compact structure can be operated in transmit mode or in receive mode. In these specific modes, the structure delivers the impedance levels relevant to the attached processing blocks and may have a frequency selective behavior in order to reject the frequencies that lie outside a particular frequency band of interest.

In such related systems, the input and output signals to be combined are either both single-ended or both differential. In the embodiments shown below, it may be possible that a differential and a single-ended signal can be combined together into a single single-ended signal.

The circuit may provide a combination of a differential and single-ended signal between which the structure is able to switch. The resulting input/output signal may be a single-ended signal. During active mode, either the differential or the single-ended signal obtains the condition of optimum impedance match as delivered by the structure. The resulting input/output single-ended signal may obtain the condition of optimum impedance match in both active modes.

In some applications, such as applications that have low levels of output power, it may be beneficial to use single-ended power amplifier (PA) operation. It helps in reducing the load transformation ratio for a certain amount of output power. For a rail to rail output stage having a swing between the supply voltage VDD and 0V, the power delivered to a load $R_L$ is:

$$P_{L\_se} = \frac{VDD^2}{8B_L}.$$

If two differential outputs, each swinging between 0V and VDD in opposite phase, have to deliver the same amount of output power, the differential load is $R_{L\_diff}=4R_{L\_se}$, which is four times the single-ended load value. For low output power values this may result in relatively high resistive load values, necessitating relatively large transformation ratios from a typical unbalanced antenna impedance (such as, for example, 50 ohm).

For example, if the desired output power is 1 mW and the supply voltage 1.2V, a single-ended load of 180Ω would be needed, only a transformation ratio of 3.6 from a 50Ω load. To realize the same amount of output power with a differential solution, a load of 720Ω would be needed and a transformation ratio of 14.4.

High transformation ratios are difficult to realize on-chip because the resulting passive component values may become quite large, occupy a large chip area and have a low self-resonance frequency. This may limit the possibility to integrate the matching network on chip. High transformation ratios may reduce the achievable bandwidth of the matching network.

Furthermore, single-ended operation may make it possible to omit the balun converter which is for a PA located at its output. At the output the power levels are the highest and losses the most harmful.

A differential input for the LNA may be beneficial in some scenarios, for example for reducing the influence of unwanted common mode signals that enter the sensitive LNA input.

In the examples described herein in detail, the differential circuit is for the reception of signals, using an LNA. However, other kinds of differential amplifiers can be used. Moreover, the differential circuit may also be used for transmitting signals. The skilled person is capable of modifying the examples herein to make such changes.

Moreover, in the examples described herein in detail, the single-ended circuit is for the transmission of signals, using a PA. However, other kinds of single-ended amplifiers can be used instead of a PA. Moreover, the single-ended circuit may also be used for receiving signals. The skilled person is capable of modifying the examples herein to make such changes.

For example, the LNA could be single-ended (for amplifying a received signal) and the PA differential (for amplifying a signal to be transmitted). Alternatively, two different transmission circuits (single-ended and differential), or two different reception circuits could be implemented on a single IC, sharing one single-ended pin to connect to e.g. an antenna.

The differential circuit and the single-ended circuit may also be used to support different transmission standards, such as Wifi, Bluetooth, or NFC.

Figure 2:
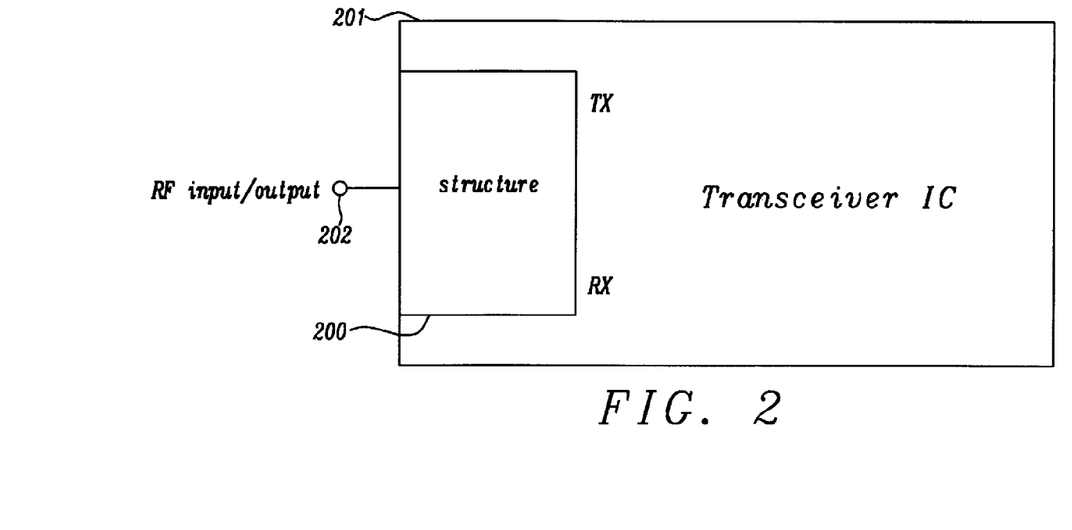
FIG. 2 illustrates an integrated structure on a transceiver IC.

FIG. 2 gives a general overview of an on-chip structure 200. The structure 200 is part of a transceiver integrated circuit (IC) 201. The structure 200 may, for example, replace the TX balun 105, the RX balun 106, the matching networks 103 and 104, the switch 107, and the frequency selective device (filter) 109 as shown in FIG. 1.

The TX and the RX on-chip signals can be differential or single-ended. The RF input/output signal is single-ended and provides an interface towards the external antenna. The pin 111 on the transceiver IC 100, for controlling the external switch 107, shown in FIG. 1, can be omitted. The switching between TX and RX mode may be done on-chip inside the structure 200.

In the following, more specific examples of the structure 200 will be described. However, these should be considered as examples, not limiting the scope of the invention.

Figure 3:
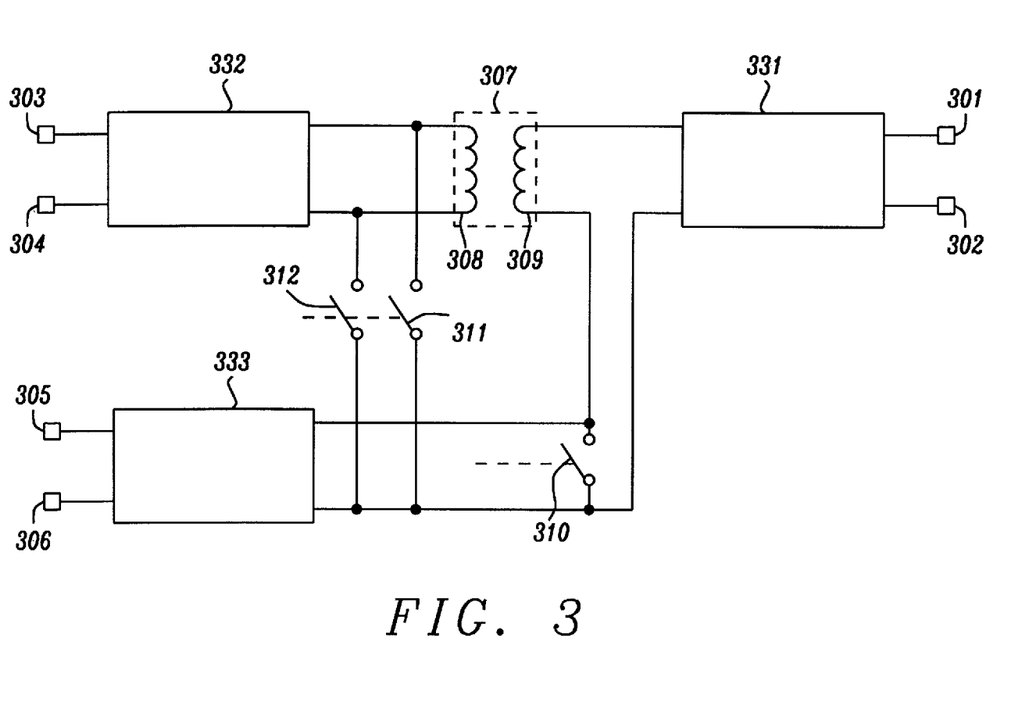
FIG. 3 illustrates an implementation of an on-chip structure.

A general implementation of the described on-chip structure can be found in FIG. 3. The figure illustrates a single-ended RF input/output 301 with corresponding ground 302, a differential input/output (I/O) 303, 304, and a single-ended input/output 305 with corresponding ground 306. FIG. 3 further shows a first matching network 331, a second matching network 332, and a third matching network 333. Depending on the applicable impedance levels, the matching networks may have more or fewer parts. In the most extreme case, a matching network could be empty. The matching networks may comprise a capacitor, and/or an impedance, for example.

The term "differential mode" refers to the situation that the differential input/output 303, 304 is active. The term "single-ended mode" refers to the situation that the single-ended input/output 305 is active. In both cases, the single-ended RF input/output 301 is active.

The shown structure further comprises a transformer 307 that has a primary side 308 connected to the second matching network 332. The transformer 307 further comprises a secondary side 309 connected to the first matching network. The first matching network 331 is connected to the third matching network 333. These connections may be switched on and off using a set of switches. There are different ways in which the switches may be arranged, while still allowing the structure to switch between differential mode and single-ended mode. FIG. 3 shows an example arrangement of the switches. Other arrangements are shown in the figures and will be described hereinafter.

The switches may be used to configure multiple operating modes. For example, in a first operating mode, the second matching network (332) is connected with the first matching network 331 via the transformer 307. This way, the differential circuit 303, 304 is connected to the RF input/output 301 via the first and second matching network. In a second operating mode, the third matching network 333 may be connected with the first matching network 331. This way, the single-ended circuit 305, 306 is connected to the RF input/output 301 via the first and third matching network. These two connections may be mutually exclusive, meaning that when the second matching network is connected with the first matching network, the first matching network is disconnected from the third matching network; and when the first matching network is connected to the third matching network, the second matching network is disconnected from the first matching network.

In general, at least one of the switches in the set of at least one switch may be configured to act, when open, as a capacitor that is part of at least one of the matching networks.

The different operating modes may be used to implement different transmission protocols that need different impedance matching. Additionally or alternatively, they may be used to implement different receiving and reception circuits.

In more detail, the configuration of FIG. 3 is as follows. A signal line 301 of the single-ended RF signal is connected via the first matching network 331 to one end of the secondary side 309 of the transformer 307. The ground 302 of the single-ended RF signal is connected via the first matching network 331 and the third matching network 333 to the ground 306 of the single-ended on-chip processing circuit (not shown). The other side of the secondary side 309 of the transformer 307 is connected via the third matching network 333 to the signal line 305 of the single-ended signal. Moreover, said other side of the secondary side 309 of the transformer 307 is connected to ground via a switch 310. The two ends of the primary side 308 of the transformer 307 are connected via the second matching network 332 to the differential signal lines 303 and 304 of the differential on-chip processing circuit (not shown). These two ends are also connected to ground via switches 311 and 312.

In differential mode, the switch 310 is closed and may effectively short the right side (in the diagram) of the single-ended matching network 333. The switch 310, when closed, thus may effectively short the signal line 305 of the single-ended circuit via the third matching network 333. In this mode, one branch of the secondary side of the transformer Tr is shorted to ground. In this way, the transformer 307 is configured to act as a balun. The differential signal provided at points 303 and 304 is matched and connected to the matched single-ended RF input/output 301, 302. The switches 311 and 312 are open in differential mode. These switches 311 and 312 can be configured to act as capacitors to ground and can be part of the matching network for the differential input/output 303, 304.

In single-ended mode the two switches 311, 312 are closed and effectively short the right side (as shown in the diagram) of the differential matching network 332, opposite the differential signal lines 303, 304. In this mode, the primary side 308 of the transformer 307 is shorted to ground (gnd). In this configuration, the secondary side 309 of the transformer 307 can function as an inductor, which can be used as part of the matching network 331 (or, alternatively, 333) for the RF input/output. In single-ended mode, the switch 310 may be open and can be configured to act as a capacitor to ground (gnd). This capacitor to ground can be part of the matching network 333 (or, alternatively, 331) for the single-ended input/output.

The combination of the matching networks 331, 332, and 333, the state of the switches 310, 311, and 312, and the integrated transformer 307 may be used to determine the final impedance transformation in both modes.

Some parts in FIG. 3 may be used in both modes. In differential mode, the switch 310 is closed and acts as a short, while in single-ended mode the switch acts as a capacitor and may act as part of the matching network 333 for the single-ended input/output. In differential mode, the transformer 307 may act as a balun, while in single-ended mode the transformer 307 (in combination with the closed switches 311 and 312) may act as an inductor, which is part of the matching network 331 towards the single-ended RF input/output.

Parts of the matching networks or the complete structure could also be made tunable or switchable to introduce more freedom for achieving the desired impedance transformation in both modes.

Figure 4:
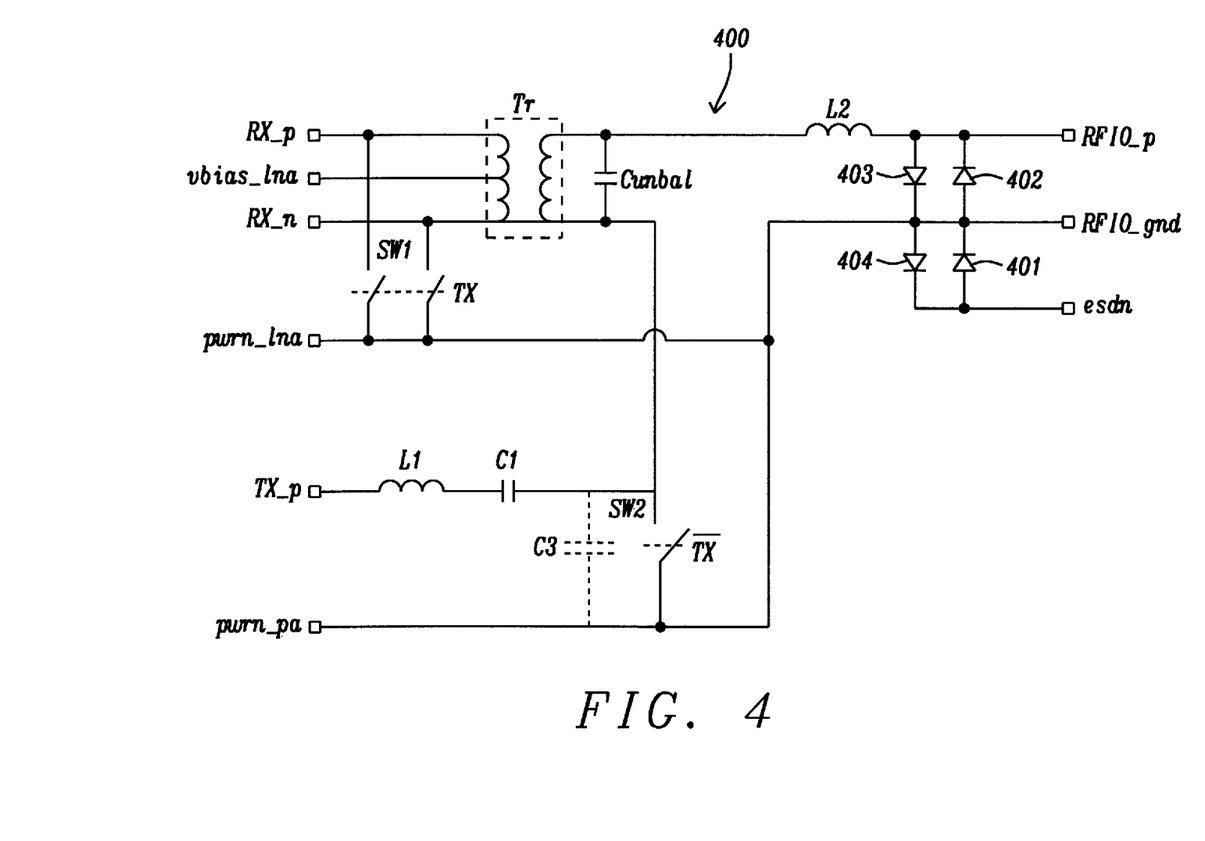
FIG. 4 illustrates an integrated structure on a transceiver IC.

FIG. 4 shows an example implementation of such an on-chip structure 400. For example, the on-chip structure may be implemented on a Bluetooth low-energy transceiver. However, the on-chip structure may also be implemented on other kinds of transceivers. The symbols RX_p, RX_n indicate the on-chip differential signals towards the on-chip differential circuit. Hereinafter, the on-chip differential circuit will be referred to as on-chip LNA. However, it will be understood that the on-chip differential circuit may also be another kind of circuit, for example another kind of amplifier. The symbol pwrn_lna indicates the ground connection for the on-chip LNA, while the symbol vbias_lna indicates an optional DC connection towards the LNA input through the structure. The symbol TX_p indicates the on-chip single-ended signal from the on-chip single-ended circuit. Hereinafter, the on-chip single-ended circuit will be referred to as on-chip PA. However, it will be understood that the on-chip single-ended circuit may also be another kind of circuit, for example another kind of amplifier. The symbol pwrn_pa indicates the ground connection for the on-chip PA. Both the LNA and the PA need a different optimum input or output impedance during their active mode. The single-ended RF input/output is indicated by symbol RFIO_p. The ground of the single-ended RF input/output is indicated by symbol RFIO_gnd. The single-ended RF input/output between RFIO_p and RFIO_gnd is matched to a certain impedance during both active modes.

The symbol esdn indicates the connections for electrostatic discharge (ESD) protection. The diodes 401, 402, 403, 404 are also for this purpose. These components are optional and do not necessarily form part of the matching networks.

As shown in FIG. 4, the set of switches may comprise first switches SW1 to connect two ends of the primary side of the transformer (Tr) with a ground and a second switch SW2 to connect an end of the secondary side of the transformer (Tr) with a ground. In the first operating mode, the first switches SW1 may be open and the second switch SW2 closed. However, in the second operating mode, the first switches SW1 may be closed and the second switch SW2 open. In the second operating mode, the second switch SW2 acts as a capacitor C3 forming part of the third impedance matching network 333.

The symbol Tr represents an on-chip transformer. The switching between the two active modes (TX-mode and RX-mode) may be accomplished with the switches SW1 and SW2. In the shown example, the TX-mode is a single-ended mode, whereas the RX-mode is a differential mode. However, it is also possible that the TX-mode is a differential mode and RX mode is a single-ended mode. For proper RX-mode performance, SW2 creates a low ohmic short to ground when it is closed. This means that SW2 may be a switch with a relatively large size. For proper TX-mode a substantial amount of capacitance from SW2 may be desired when SW2 is open. This capacitance may reduce or totally replace the necessary capacitance to ground in the PA matching network. With the configuration of SW2 as shown in FIG. 4 this combined functionality for both TX-mode and RX-mode is possible. In TX-mode the switches SW1 may be closed, while in RX-mode switch SW2 may be closed.

Figure 5:
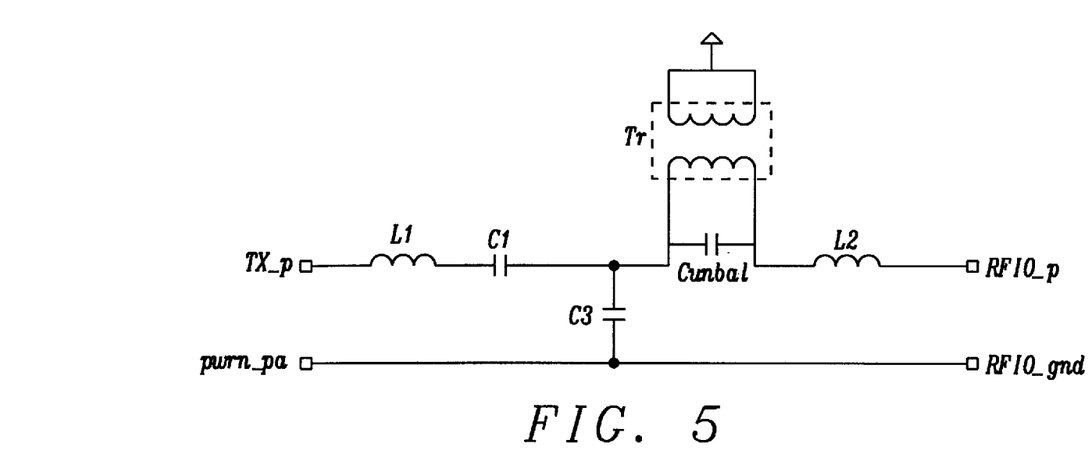
FIG. 5 illustrates an equivalent circuit representation in TX-mode.

FIG. 5 shows a circuit representation that is equivalent to the circuit of FIG. 4 in TX-mode (the ESD part is not shown). The primary side of the transformer Tr may be shorted to ground by the switches SW1. This short transforms to the secondary side of the transformer Tr and in combination with the capacitor Cunbal it can be represented by a relatively low ohmic short with some inductance. This inductance can be used to effectively lower the inductance (given by L2) that is needed for the matching of the PA output. This saves chip area.

Capacitor C1 and inductor L1 may be part of the single-ended matching network of the single-ended PA. They may be dimensioned to create a series resonance at a particular frequency of operation. In case of Bluetooth, the frequency of interest may be 2.4 GHz, for example. With the help of this series resonator, out of the non-linear output signal that the PA generates, a desired frequency component may be enhanced and/or unwanted frequency components may be reduced. Switch SW2 may be open and may be dimensioned in such a way that it can be represented by a capacitor C3 with a certain value. Together with the inductor L2 and the equivalent secondary inductance of the shorted transformer, capacitor C3 may form a low-pass network that may be used to match the output impedance of the PA to the desired terminating impedance of the RFIO_p. In this specific, exemplary, case this could be a 50 Ohm termination. The low-pass behavior may be used to lower unwanted spurious and harmonics during the TX-mode.

Figure 6:
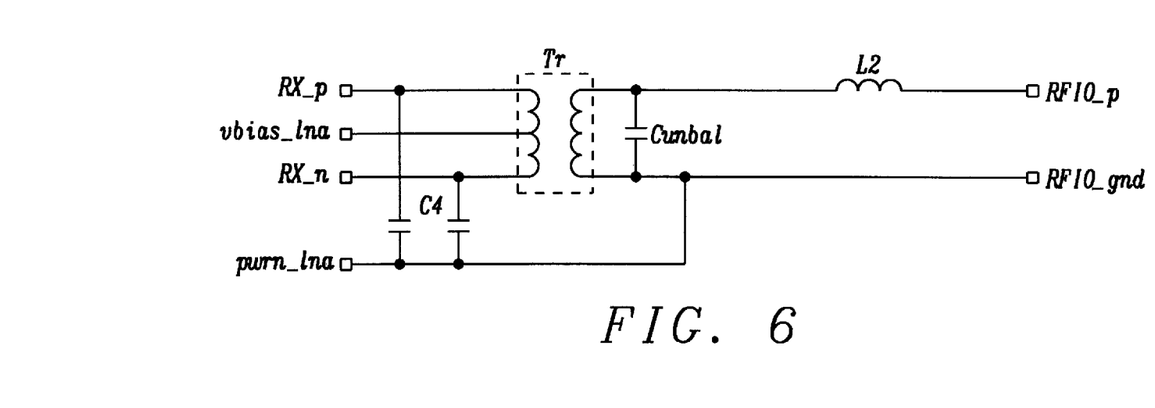
FIG. 6 illustrates an equivalent circuit representation in RX-mode.

FIG. 6 shows an equivalent circuit representation of the circuit of FIG. 4 in RX-mode (any ESD components are not shown). In this mode the switch SW2 may be closed and provide a short for one side of the on-chip transformer Tr. The switches SW1 may be open and can be represented by two small capacitances C4 to ground, which may be part of the matching network towards the LNA. The capacitor Cunbal together with the transformer Tr may act as an on-chip balun that can convert the desired differential input impedance for the LNA towards the desired single-ended impedance at RFIO_p. It could be possible to make the capacitor Cunbal tunable or switchable to have more control over the matching in TX and/or RX-mode. Together with inductor L2, capacitor Cunbal may form a low-pass structure that helps to reduce unwanted blocking signals from entering the receiver.

By changing the values and dimensions of the components in FIG. 4, a different optimum impedance can be obtained on all ports during either the TX-mode or RX-mode. The configuration of the components in FIG. 4 can also be modified to account for a differential PA output and a single-ended LNA input.

Figure 7:
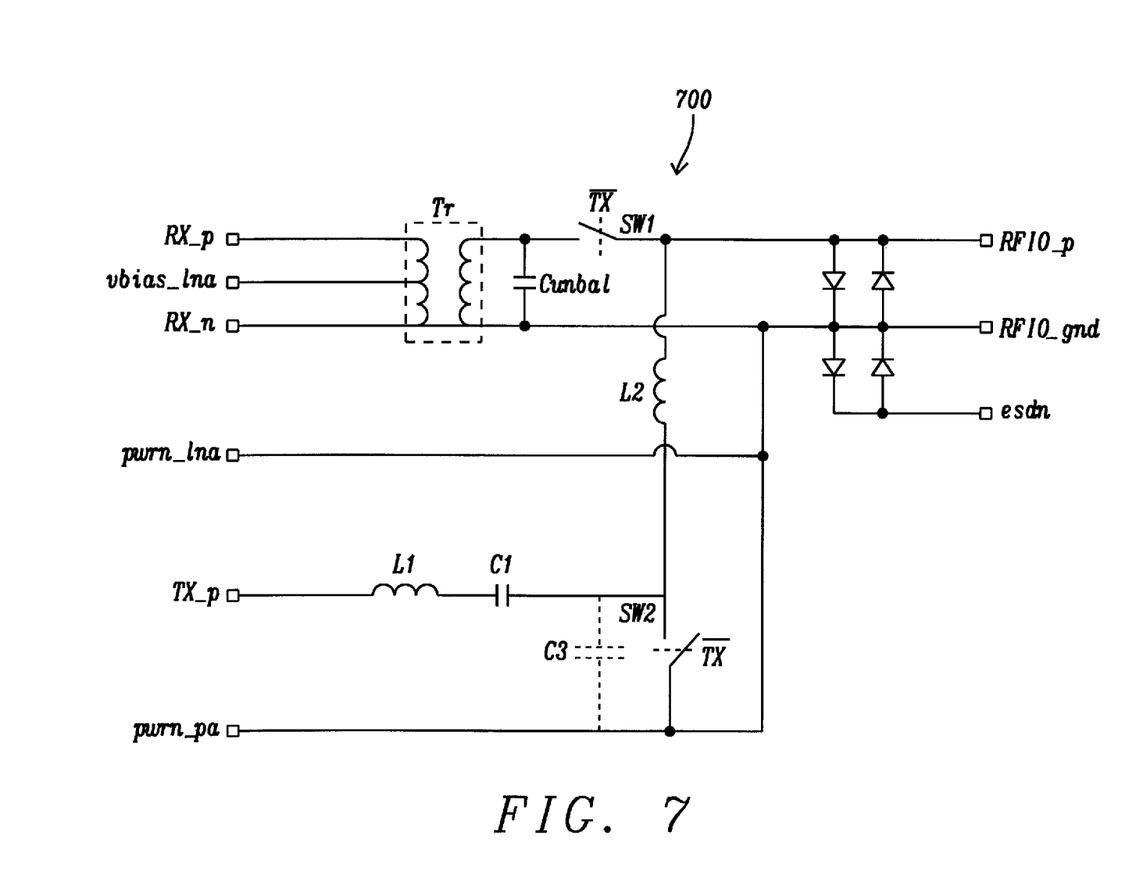
FIG. 7 illustrates an alternative integrated structure on a transceiver IC.

FIG. 7 shows an alternative configuration for the example circuit of FIG. 4. The switching between the two active modes (TX-mode and RX-mode) is accomplished with the switches SW1 and SW2. When closed, the switch SW1 connects an end of the secondary side of the transformer Tr with the single-ended pin RFIO_p and with one end of inductor L2. When closed, the second switch SW2 connects the other end of inductor L2 with ground. In TX-mode the switches SW1 and SW2 may be open, while in RX-mode switches SW1 and SW2 may be closed. In TX-mode the open switch SW1 can be represented by a capacitor that isolates the balun from the rest of the structure. Compared to FIG. 4, the inductor L2 is moved towards SW2 and still acts as a low-pass filter. In RX-mode switch SW1 may be closed and place inductor L2 in parallel with the balun formed by the transformer Tr. The inductor L2 together with the secondary inductance of the transformer Tr and capacitor Cunbal may have a band-pass behavior that may help to reduce unwanted blocking signals from entering the receiver. With proper sizing of the components the desired matching in both the TX-mode and RX-mode can be obtained as well as the RFIO input/output matching.

Figure 8:
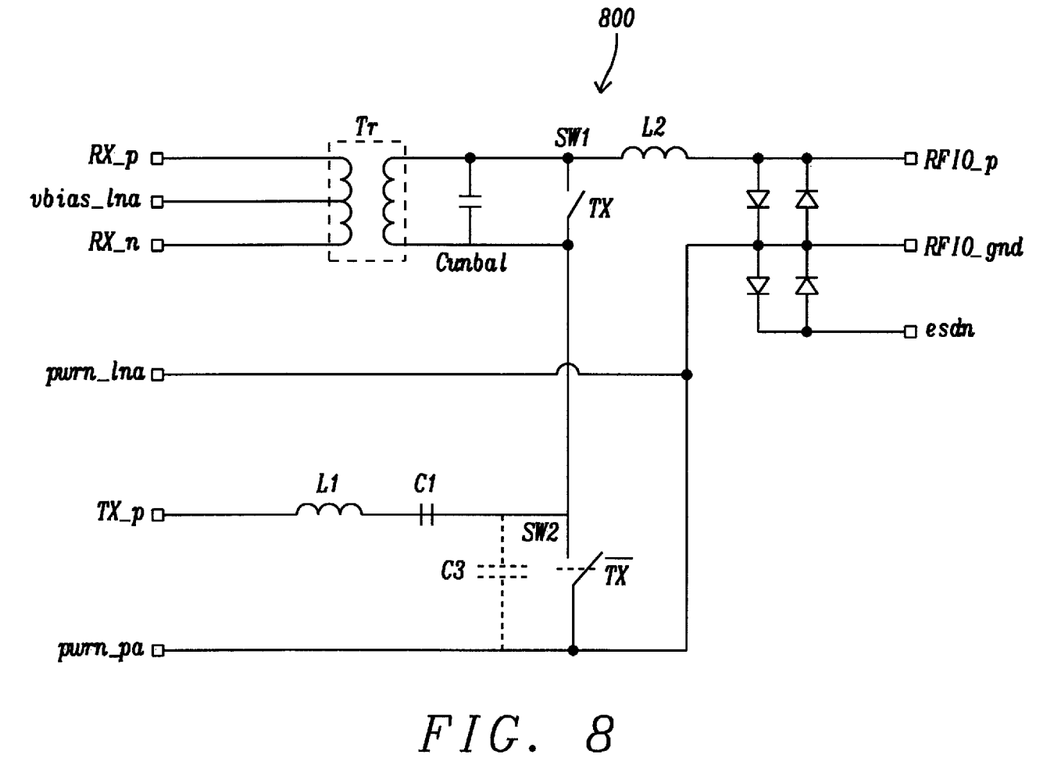
FIG. 8 illustrates another alternative integrated structure on a transceiver IC.

FIG. 8 shows a configuration of a circuit 800 in which the switch SW1 is placed in parallel with the capacitor Cunbal. In other words, the switch SW1, when closed, connects two ends of the secondary side of the transformer Tr. When closed, the second switch SW2 connects an end of the secondary side of the transformer Tr with a ground. In the RX-mode, the switch SW1 is open and the switch SW2 is closed. In the TX-mode, the switch SW1 is closed and the switch SW2 is open. In TX-mode the switch SW1 may short the secondary side of the transformer Tr. With proper sizing of the components the desired matching in both the TX-mode and RX-mode can be obtained as well as the RFIO input/output matching.

Figure 9:
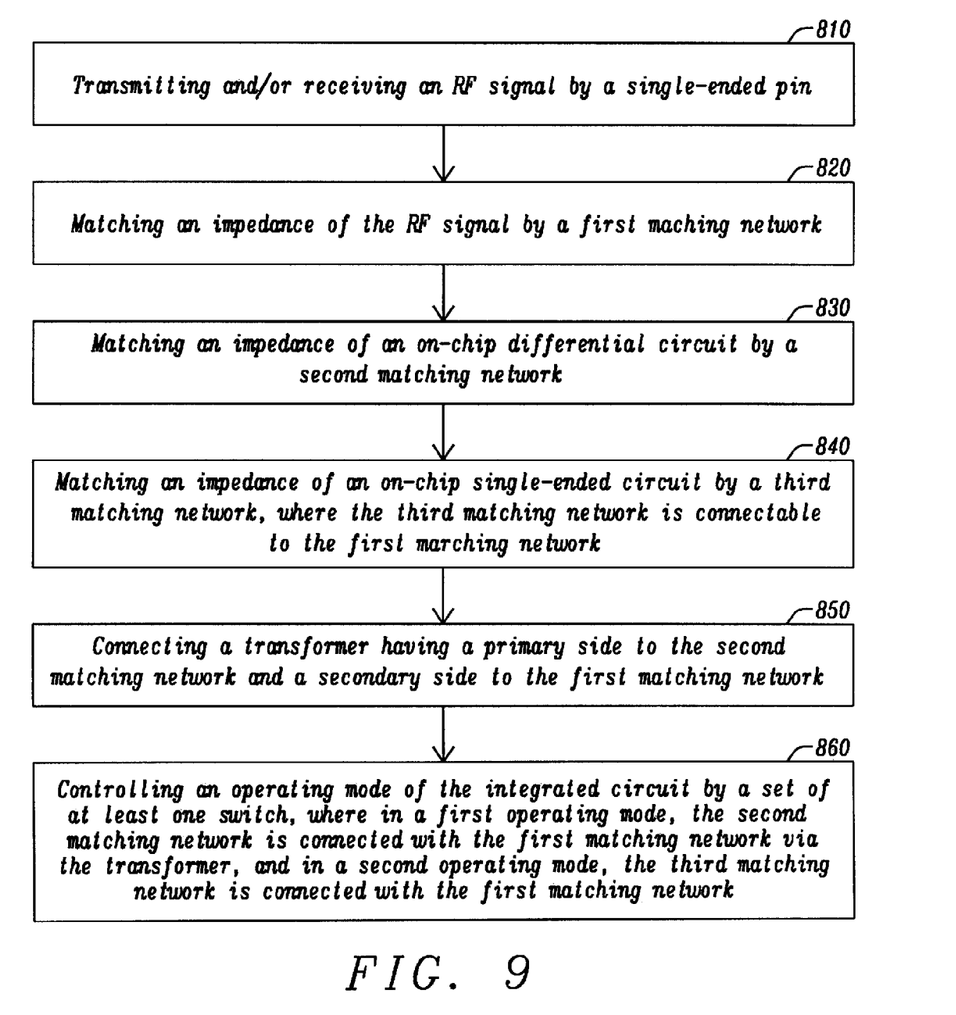
FIG. 9 is a flowchart which describes a method embodiment.

FIG. 9 is a flowchart which documents a method for transmitting and/or receiving an RF signal 810. It documents the requirements of matching impedances 820, 830, 840 on an integrated circuit which is populated by several matching networks and switches. It also describes two operating modes 860. It describes both a single-sided circuits and differential circuits 830, 840. The flowchart also describes the interfacing of a transformer to specific matching networks. 850

It is noted that parts of the structure disclosed herein may be configured to act as a band-pass or a low-pass filter. Moreover, to allow fine-tuning of the matching networks, two ends of the secondary side of the transformer (Tr) may be connected by means of a capacitor that is tunable or switchable. Specifically, the capacitor may be configured to be switched between capacitance values needed to match an impedance of two different transmission standards.

The techniques disclosed herein may help solve the problem of combining differential and single-ended signals into a single single-ended input/output signal. An advantage may be that the circuit allows to omit expensive (both in placement and component cost) and area consuming external matching network components, baluns, switch and frequency selective element outside the transceiver IC perimeter. The number of input/output pins may be reduced by integrating the balun, the matching network, the switch and the frequency selective device on the transceiver IC, because no separate input/output pins need to be provided, and no pin is needed to control an external switch to switch between differential and single-ended mode. Moreover, use of the IC is simplified, because the IC can be connected to an external antenna without much knowledge of RF circuits.

The examples and embodiments described herein serve to illustrate rather than limit the invention. The person skilled in the art will be able to design alternative embodiments without departing from the scope of the claims. Reference signs placed in parentheses in the claims shall not be interpreted to limit the scope of the claims. Items described as separate entities in the claims or the description may be implemented as a single hardware or software item combining the features of the items described. Use of the verb "comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

What is claimed is:

1. An integrated circuit, comprising:
    a single-ended pin for transmitting and/or receiving an RF signal;
    a first matching network to match an impedance of the RF signal;
    a second matching network to match an impedance of an on-chip differential circuit;
    a third matching network to match an impedance of an on-chip single-ended circuit, wherein the third matching network is connectable to the first matching network;
    a transformer having a primary side connected or connectable to the second matching network and a secondary side connected or connectable to the first matching network;
    one or more switches for controlling an operating mode of the integrated circuit, wherein
    in a first operating mode, the second matching network is connected with the first matching network via the transformer, and
    in a second operating mode, the third matching network is connected with the first matching network.

2. The system according to claim 1, wherein at least one said one or more switches is configured to act, when open, as a capacitor that is part of at least one of the matching networks.

3. The circuit of claim 1, wherein one of the differential circuit and the single-ended circuit comprises a low-noise amplifier "LNA" for amplifying the signal received from the single-ended pin, and the other one of the differential circuit and the single-ended circuit comprises a power amplifier "PA" for amplifying the signal that is to be provided to the single-ended pin.

4. The circuit of claim 3, wherein the differential circuit comprises the low-noise amplifier, and wherein the single-ended circuit comprises the power amplifier.

5. The circuit of claim 1, wherein either of the first operating mode and the second operating mode is an RF signal receiving mode, and the other operating mode is an RF signal transmitting mode.

6. The circuit of claim 1, wherein the differential circuit is configured to process signals according to a first transmission standard, and the single-ended circuit is configured to process signals according to a second transmission standard, wherein the first transmission standard is different from the second transmission standard.

7. The circuit of claim 1, wherein, in the second operating mode, the secondary side of the transformer is configured to function as an inductor of the first impedance matching network and/or the third impedance matching network.

8. The circuit of claim 1, wherein, in the first operating mode, one end of the secondary side of the transformer is grounded, wherein the transformer is configured to act as a balun.

9. The circuit of claim 1, wherein one switch comprises first switches to connect two ends of the primary side of the transformer with a ground and a second switch to connect an end of the secondary side of the transformer with a ground, and wherein
in the first operating mode, the first switches are open and the second switch is closed; and
in the second operating mode, the first switches are closed and the second switch is open.

10. The circuit of claim 9, wherein, in the second operating mode, the second switch is configured to act as a capacitor forming part of the third impedance matching network.

11. The circuit of claim 1, wherein the set of at least one switches comprises a first switch to connect an end of the secondary side of the transformer with the single-ended pin and a second switch, wherein the second switch connects a signal line of the single-ended circuit with ground, and wherein
in the first operating mode, the first switch is closed and the second switch is closed; and
in the second operating mode, the first switch is open and the second switch is open.

12. The circuit of claim 1, wherein the set of at least one switches comprises a first switch to connect two ends of the secondary side of the transformer, and a second switch to connect an end of the secondary side of the transformer with a ground, and wherein
in the first operating mode, the first switch is open and the second switch is closed; and
in the second operating mode, the first switch is closed and the second switch is open.

13. The circuit of claim 1, wherein at least part of the circuit is configured to act as a band-pass or a low-pass filter.

14. The circuit of claim 1, wherein two ends of the secondary side of the transformer are connected by means of a capacitor that is tunable or switchable.

15. The circuit of claim 14, wherein the capacitor is configured to be switched between capacitance values needed to match an impedance of two different transmission standards.

16. A method of transmitting and/or receiving an RF signal, comprising the steps of:
transmitting and/or receiving an RF signal by a single-ended pin;
matching an impedance of the RF signal by a first matching network;
matching an impedance of an on-chip differential circuit by a second matching network;
matching an impedance of an on-chip single-ended circuit by a third matching network, wherein the third matching network is connectable to the first matching network;
connecting a transformer having a primary side to the second matching network and a secondary side to the first matching network;
controlling an operating mode of the integrated circuit by one or more switches, wherein in a first operating mode, the second matching network is connected with the first matching network via the transformer, and
in a second operating mode, the third matching network is connected with the first matching network.

17. The method according to claim 16, wherein at least one switch of said one or more switches acts, when open, as a capacitor that is part of at least one of the matching networks.

18. The method of claim 16, wherein one of the differential circuit and the single-ended circuit comprises a low-noise amplifier "LNA" for amplifying the signal received from the single-ended pin, and the other one of the differential circuit and the single-ended circuit comprises a power amplifier "PA" for amplifying the signal that is to be provided to the single-ended pin.

19. The method of claim 16, wherein the differential circuit comprises the low-noise amplifier, and wherein the single-ended circuit comprises the power amplifier.

20. The method of claim 16, wherein either of the first operating mode and the second operating mode is an RF signal receiving mode, and the other operating mode is an RF signal transmitting mode.

21. The method of claim 16, wherein the differential circuit processes signals according to a first transmission standard, and the single-ended circuit processes signals according to a second transmission standard, wherein the first transmission standard is different from the second transmission standard.

22. The method of claim 16, wherein, in the second operating mode, the secondary side of the transformer functions as an inductor of the first impedance matching network and/or the third impedance matching network.

23. The method of claim 16, wherein, in the first operating mode, one end of the secondary side of the transformer is grounded, wherein the transformer acts as a balun.

24. The method of claim 16, wherein the set of at least one switches comprises first switches to connect two ends of the primary side of the transformer with a ground and a second switch to connect an end of the secondary side of the transformer with a ground, and wherein
in the first operating mode, the first switches are open and the second switch is closed; and
in the second operating mode, the first switches are closed and the second switch is open.

25. The method of claim 24, wherein, in the second operating mode, the second switch acts as a capacitor forming part of the third impedance matching network.

26. The method of claim 16, wherein the set of at least one switches comprises a first switch to connect an end of the secondary side of the transformer with the single-ended pin and a second switch, wherein the second switch connects a signal line of the single-ended circuit with ground, and wherein
- in the first operating mode, the first switch is closed and the second switch is closed; and
- in the second operating mode, the first switch is open and the second switch is open.

27. The method of claim 16, wherein the set of at least one switch comprises a first switch to connect two ends of the secondary side of the transformer, and a second switch to connect an end of the secondary side of the transformer with a ground, and wherein
- in the first operating mode, the first switch is open and the second switch is closed; and
- in the second operating mode, the first switch is closed and the second switch is open.

28. The method of claim 16, wherein at least part of the circuit acts as a band-pass or a low-pass filter.

29. The method of claim 16, wherein two ends of the secondary side of the transformer are connected by means of a capacitor that is tunable or switchable.

30. The method of claim 29, wherein the capacitor is switched between capacitance values needed to match an impedance of two different transmission standards.

* * * * *